(12) United States Patent
Abdelli et al.

(10) Patent No.: US 8,098,097 B2
(45) Date of Patent: Jan. 17, 2012

(54) RADIO FREQUENCY BUFFER

(75) Inventors: Said Abdelli, Minneapolis, MN (US); Jeffrey Kriz, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/646,329

(22) Filed: Dec. 23, 2009

(65) Prior Publication Data
US 2011/0148524 A1   Jun. 23, 2011

(51) Int. Cl.
*H03F 3/45* (2006.01)
(52) U.S. Cl. .................... 330/254; 330/301
(58) Field of Classification Search .............. 330/301, 330/252–261; 333/25–26
See application file for complete search history.

(56) References Cited

U.S. PATENT DOCUMENTS

| | | | |
|---|---|---|---|
| 4,739,281 A | 4/1988 | Doyle | |
| 5,450,356 A | 9/1995 | Miller | |
| 6,255,909 B1 | 7/2001 | Muza | |
| 6,384,675 B1 | 5/2002 | Ang et al. | |
| 6,970,043 B2 * | 11/2005 | Pradhan et al. | 330/253 |
| 7,242,250 B2 | 7/2007 | Tsurumi | |
| 7,271,655 B2 | 9/2007 | Berkhout | |
| 7,466,201 B1 * | 12/2008 | Ivanov et al. | 330/264 |
| 2004/0189389 A1 | 9/2004 | Suzuki | |
| 2009/0058523 A1 | 3/2009 | Ogata | |

* cited by examiner

*Primary Examiner* — Hieu Nguyen
(74) *Attorney, Agent, or Firm* — Shumaker & Sieffert, P.A.

(57) ABSTRACT

Systems, methods, and devices for receiving a differential input signal and generating a non-differential output signal are described herein. For example, an RF buffer is described that includes first and second transistor elements. The first transistor element receives a first polarity signal of a differential signal and drives a non-differential output of the RF buffer. A second transistor element receives a second polarity signal of the differential signal and drives the non-differential output of the RF buffer. The first and second transistor elements substantially simultaneously drive the non-differential output of the RF buffer.

18 Claims, 7 Drawing Sheets

RADIO FREQUENCY BUFFER

This invention was made with Government support under subcontract 02ESM162076 awarded by General Dynamics. The Government has certain rights in the invention.

TECHNICAL FIELD

The invention relates generally to radio frequency (RF) communications and, more specifically, to RF buffers configured to receive a differential input signal and generate a non-differential output signal.

BACKGROUND

In many electronic applications, e.g., RF communications, it is desirable to translate a differential signal (e.g. a signal that includes a first polarity signal (positive) and a second polarity signal (negative)) into a non-differential signal (e.g., a single polarity signal). Solutions have been proposed that incorporate one or more RF buffers that translate a differential input signal into a non-differential output signal. One example of such a solution is a push-pull buffer arrangement.

Push-pull buffer arrangements incorporate a first transistor that independently drives a first polarity of a differential input signal, and a second transistor that independently drives an opposite polarity of the differential input signal as a non-differential output signal. The first and second transistors alternately switch between active and non-active states. As a result of transistor switching, cross-talk, parasitic, and other effects may degrade push-pull buffer performance.

SUMMARY

This disclosure describes methods and devices that support differential-to-non-differential buffering of RF signals. In some examples, an RF buffer may include first and second transistor elements. The first transistor element receives a first polarity of a differential signal, and the second transistor element receives a second polarity of the differential signal. The first transistor element and the second transistor element substantially simultaneously drive a non-differential output of the buffer.

The buffer described in this disclosure may, unlike push-pull buffer arrangements, maintain the first and second transistor elements in an active state, such that the transistor elements do not switch during operation. For high-speed and/or high frequency data signals, transistor element switching may cause undesirable effects, such as, for example, cross talk, crossover distortion, and/or parasitic effects that may degrade buffer performance. By operating transistor elements to substantially simultaneously drive a differential signal as a non-differential output signal, a need for additional circuitry to compensate for cross talk, crossover distortion and/or parasitic effects may be reduced or eliminated.

In one example, a method is described. The method includes receiving, at an input of a first transistor element, a first polarity signal of a differential input signal. The method further includes receiving, at an input of a second transistor element, a second polarity signal of the differential input signal. The method further includes substantially simultaneously driving, by the first transistor element and the second transistor element at an output of an RF buffer circuit, the first polarity signal and the second polarity signal as a non-differential output signal of the RF buffer circuit.

In another example, a device is described. The device includes a differential gain stage that receives a differential input signal and generates a scaled differential signal. The device further includes an output buffer coupled to the differential gain stage, the output buffer includes a first transistor element with an input that receives a first polarity of the scaled differential signal. The output buffer further includes a second transistor element with an input that receives a second polarity of the scaled differential signal. The first transistor element and the second transistor element substantially simultaneously drive a non-differential output signal of the output buffer.

In another example, a device is described. The device includes means for receiving a differential input signal and generating a scaled differential signal. The device further includes first transistor element means for receiving a first polarity signal of the scaled differential signal. The device further includes second transistor element means for receiving a second polarity signal of the scaled differential signal. The first transistor element means and the second transistor element means substantially simultaneously drive a non-differential output signal.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
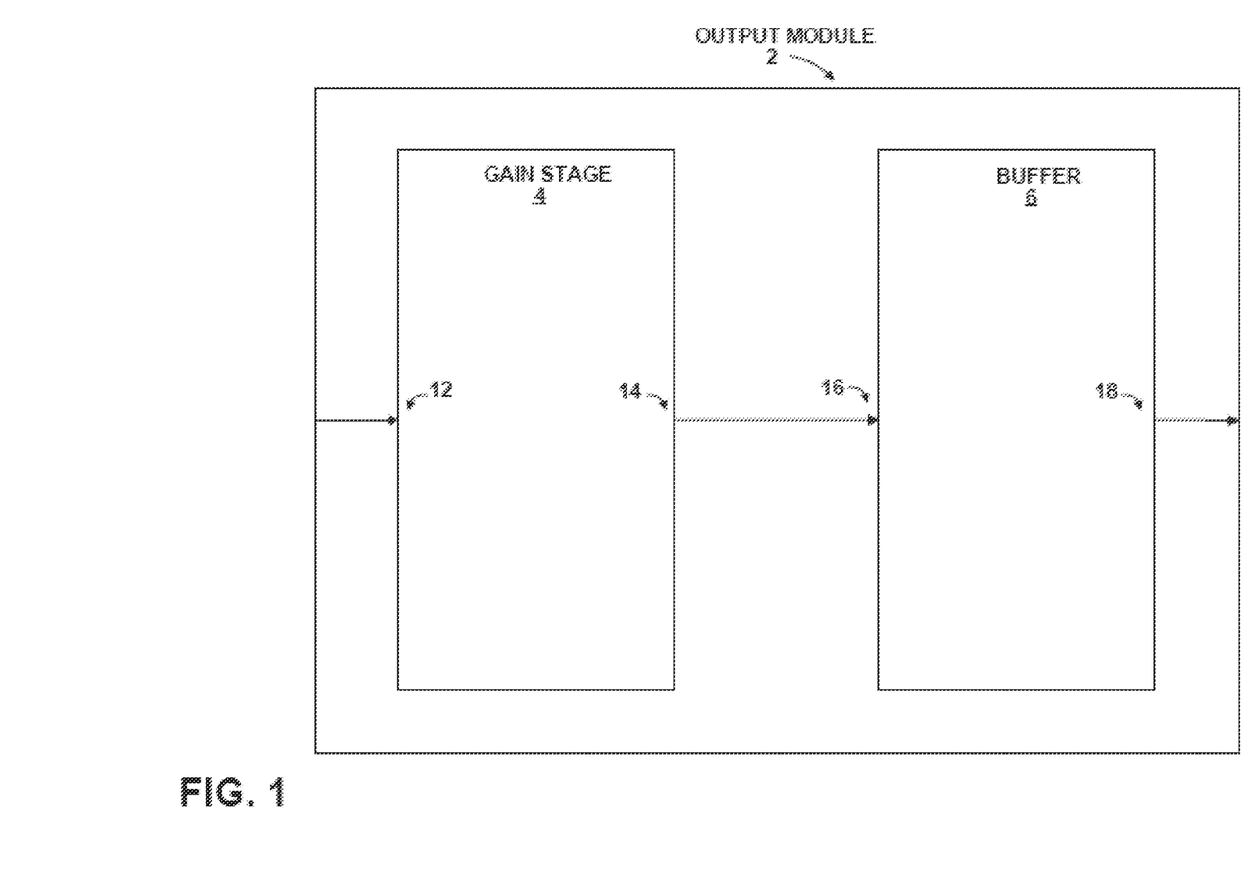
FIG. 1 is a block diagram depicting one example of an output module consistent with this disclosure.

FIG. 1 is a block diagram illustrating an output module 2 consistent with the disclosure provided herein. Output module 2 includes gain stage 4. Gain stage 4 includes an input 12 and an output 14. Gain stage 4 may be configured to receive at input 12 a differential input signal, and output a scaled differential signal at output 14. The scaled differential signal may be an amplified differential signal. The scaled differential signal may instead be an attenuated differential signal. In one example, gain stage 4 is configured to apply a direct current (DC) gain to the differential signal and output a DC-biased differential signal at output 14, for example a differential signal that carries a DC offset.

Output module 2 also includes buffer 6. Buffer 6 is configured to receive a differential signal from output 14 of gain stage 4 at buffer input 16, e.g. a scaled differential signal at output 14, and generate a non-differential output signal at buffer output 18. Buffer 6 may comprise a circuit arrangement including first and second transistor elements that each independently receive respective first and second polarity signals of a differential signal received at buffer input 16. The first and second transistor elements may substantially simultaneously drive a non-differential output signal at buffer output 18.

Figure 2:
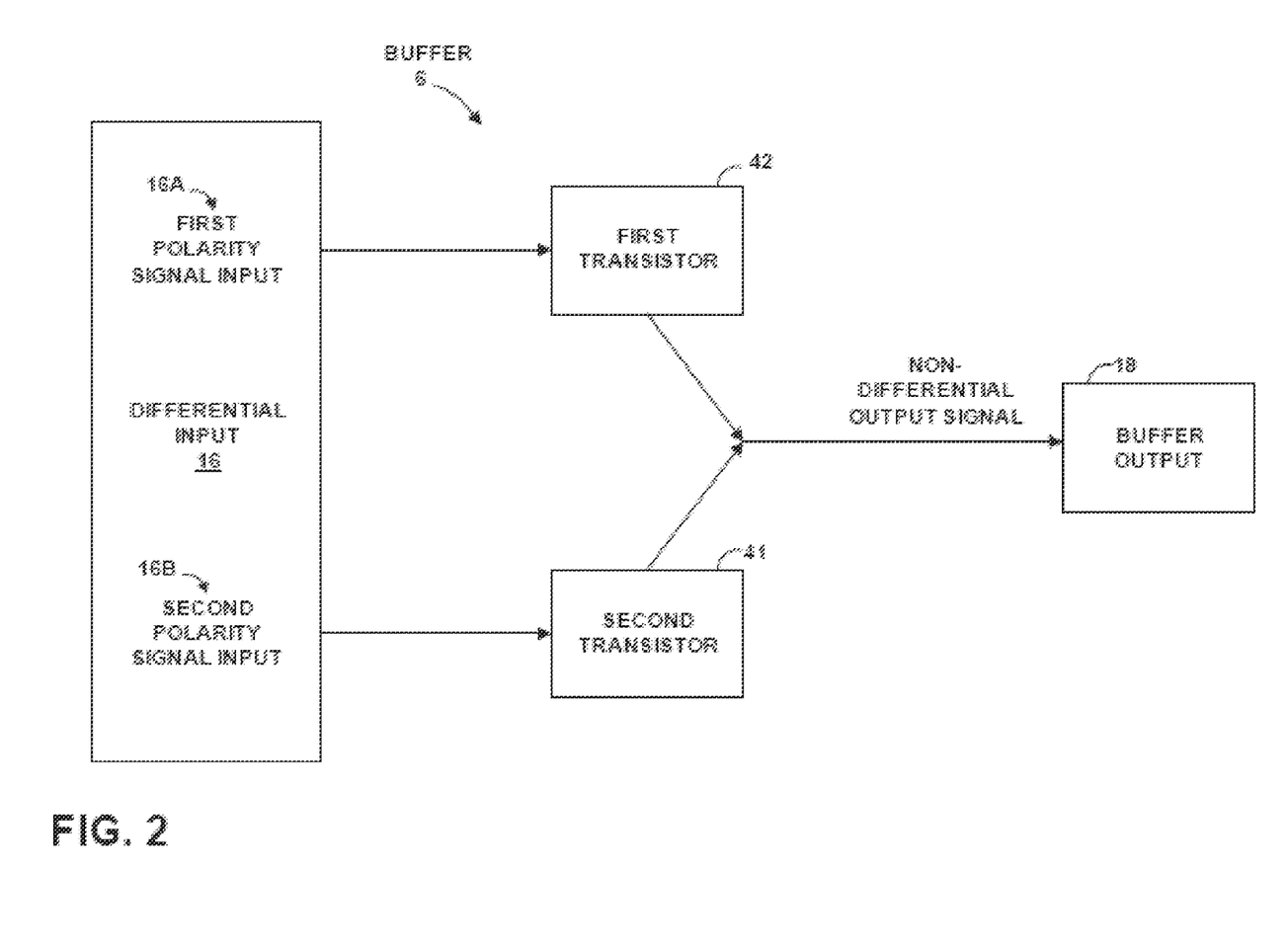
FIG. 2 is a block diagram depicting one example of a buffer consistent with this disclosure.

FIG. 2 is a block diagram illustrating one example of a buffer 6 consistent with the disclosure provided herein. Buffer 6 may correspond to an example configuration of buffer 6 in FIG. 1. As shown in FIG. 2, buffer 6 includes a differential input 16. Differential input 16 may include a first polarity signal input 16A and a second polarity signal input 16B. First polarity signal input 16A may receive an alternating current (AC) signal of a first phase, while second polarity signal input 16B may receive an AC signal of a second phase. The second phase may be substantially opposite the first phase. For example, the first and second phases may be approximately 180 degrees apart. First transistor element 42 is coupled to first polarity signal input 16A, and second transistor element 41 is coupled to second polarity signal input 16B. Buffer 6 may be operative such that first and second transistor elements 42 and 41 substantially simultaneously drive a first polarity signal at first polarity signal input 16A and a second polarity signal at second polarity signal input 16B as a non-differential output signal at buffer output 18. In one example, the first and second transistor elements 42 and 41 are both n-type metal oxide semiconductor (NMOS) field effect transistors. In another example, the first and second transistor elements 42 and 41 are both p-type metal oxide semiconductor (PMOS) field effect transistors.

First and second transistor elements 42 and 41 of buffer 6 may be operative such that, regardless of a signal level of signals at first and second polarity signal inputs 16A and 16B, transistor elements 41 and 42 are each maintained in an active state. For example, gain stage 4 may output a DC-biased differential signal. A DC bias of the DC-biased differential signal may be selected such that a signal level of signals at first and second polarity signal inputs 16A and 16B are always above a switching threshold voltage level of transistor elements 42 and 41. Thus, transistor elements 42 and 41 are maintained in an active state of operation. For example, transistor elements 42 and 41 may each have a gate bias voltage (threshold voltage: for a PMOS transistor, a gate-drain voltage, for an NMOS transistor a gate-source voltage). Transistor elements 42 and 41 may be turned on, or operate in an active state, (allow current to flow between drain and source terminals) when a voltage applied at the gate terminal is greater than a gate-bias voltage of transistor elements 42 and 41. Thus, transistor elements 42 and 41 are maintained in an active state of operation. For example, transistor elements 42 and 41 may each have a gate bias voltage (threshold voltage: for a PMOS transistor, a gate-drain voltage, for an NMOS transistor a gate-source voltage). Transistor elements 42 and 41 may be turned on, or operate in an active state, (allow current to flow between drain and source terminals) when a voltage applied at the gate terminal is greater than a gate-bias voltage of transistor elements 42 and 41.

Figure 3:
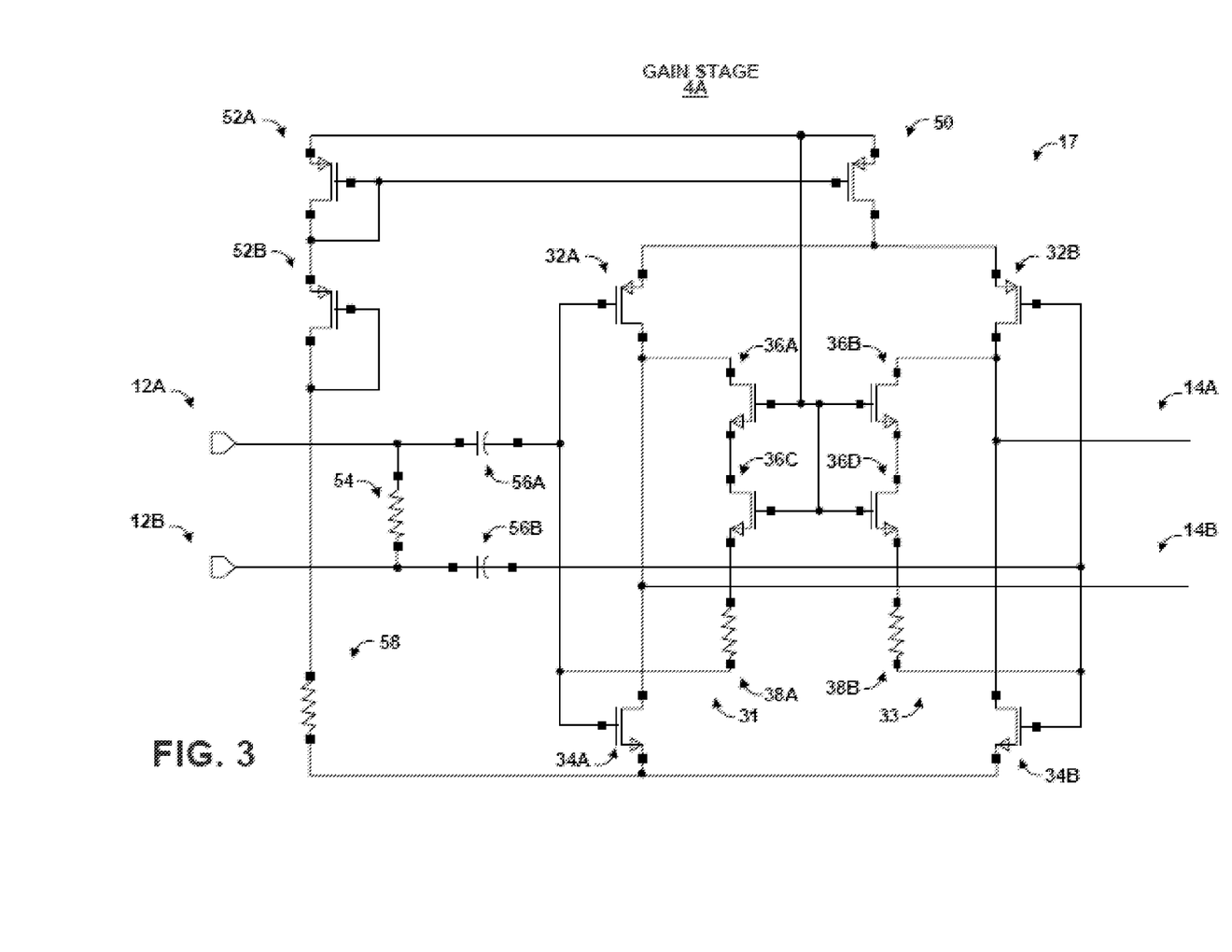
FIG. 3 is a circuit diagram depicting one example of a gain stage consistent with this disclosure.

FIG. 3 illustrates a circuit diagram of one example of a gain stage 4A consistent with this disclosure. As depicted in FIG. 3, gain stage 4A includes first polarity differential input 12A and second polarity differential input 12B. Differential inputs 12A and 12B are coupled to a differential amplifier circuit 17. As will be described in further detail, differential amplifier circuit 17 may be configured to scale a signal received at differential inputs 12A and 12B. In one example, differential amplifier circuit 17 may apply a DC bias to signal received at differential inputs 12A and 12B.

In the example of FIG. 3, resistor 54 is coupled to inputs 12A and 12B, and capacitor elements 56A and 56B are coupled to respective ends of resistor 54 and differential inputs 12A and 12B. Resistor 54 and capacitor elements 56A and 56B may operate as a filter, e.g. a high pass filter, to remove unwanted components of a signal at inputs 12A and 12B such as noise.

Gain stage 4 may also include drain-gate coupled PMOS transistors 52A and 52B, and resistor 58 coupled in series between positive and negative power supply terminals of gain stage 4. Transistors 52A and 52B, and resistor 58 may provide a bias signal for PMOS current source transistor 50. A gate of current source transistor 50 is coupled to a gate of transistor 52A. Circuit elements 52A-52B and 58 may be operative to supply a substantially constant voltage reference to the gate of transistor 50, which in turn may supply a bias current to differential amplifier circuit 17.

Differential amplifier circuit 17 may include two sets of transistor pairs, first transistor pair 32A and 32B (PMOS transistors), and second transistor pair 34A and 34B (NMOS transistors). Transistors 32A and 34A each include a gate terminal coupled to first polarity input 12A, and transistors 32B and 34B each include a gate terminal coupled to second polarity input 12B. A node between drain terminals of transistors 32B and 34B is coupled to first polarity differential output 14A, while a node between drain terminals of transistors 32A and 34A is coupled to a second polarity differential output 14B. Source terminals of transistors 32A and 32B are coupled to a drain terminal of current source transistor 50. Source terminals of transistors 34A and 34B are coupled to a negative power supply of gain stage 4A (e.g., ground).

Resistor 38A and resistor-connected transistors 36A and 36C (gate coupled to VDD) are coupled in series (collectively "second polarity feedback resistance 31") between first polarity input 12A and a drain terminal of transistor 32A. Likewise, resistor 38B and resistor-connected transistors 36B and 36D (gate coupled to VDD) are coupled in series (collectively "first polarity feedback resistance 33") between first polarity input 12B and a source terminal of transistor 32B. Arrangement of components 36A-36D and 38A-38B as first and second polarity feedback resistances 31 and 33 are provided solely for exemplary purposes. Other arrangements of resistive elements, e.g., a single resistor or one or more resistor-connected transistors substituted for one or more of, for example, resistor 38A and resistor-connected transistors 36A and 36C or resistor 38B and resistor-connected transistors 36B and 36D are also contemplated by this disclosure.

In operation, the arrangement of resistances 31 and 33 with respect to transistors 32A-32B and 34A-34B operate as a feedback loop. A DC voltage is present across first polarity feedback resistance 33 and second polarity feedback resistance 31. As arranged, resistances 31 and 33 may cause a value of respective first and second polarity output signals at differential outputs 14A and 14B to be "pulled up," to a level of DC gain determined by a resistance of resistances 31 and 33. Thus, respective first and second polarity signals at outputs 14A and 14B may represent signals at differential inputs 12A and 12B without dropping below a particular voltage level determined by a value of resistances 31 and 33. As discussed herein, differential inputs 12A, 12B, and differential outputs 14A, 14B do not necessarily refer to a signals that are differential in terms of DC voltage levels. Instead, signals 12A-12B, and 14A-14B are considered differential if AC components of these signals are of substantially opposite phase. For example, first polarity output signal 14A may be of opposite phase compared to second polarity output signal 14B.

Figure 4:
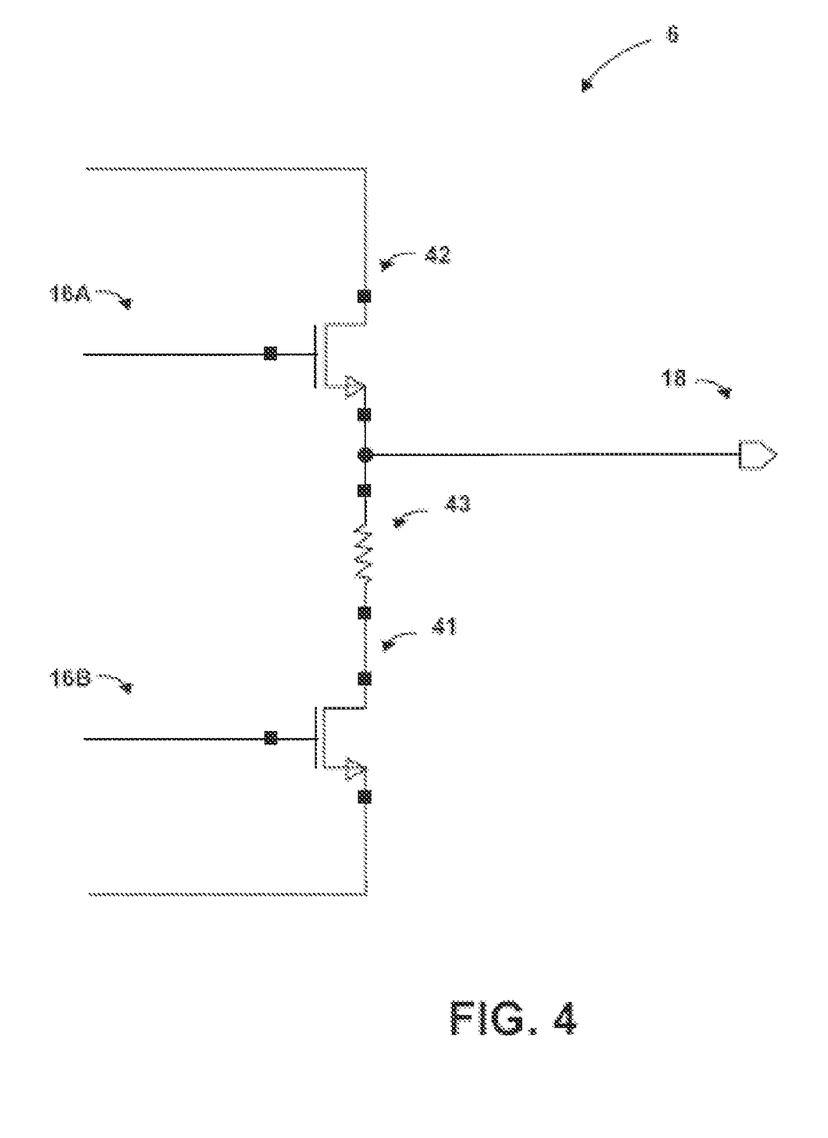
FIG. 4 is a circuit diagram depicting one example of a buffer consistent with this disclosure.

FIG. 4 is a circuit diagram that depicts one example of a buffer 6 consistent with the disclosure provided herein. As shown in FIG. 4, buffer 6 includes first transistor element 42 and second transistor element 41. First transistor element 42 includes a gate terminal coupled to first polarity input 16A. In one example, first polarity input 16A is coupled to a first polarity output 14A of gain stage 4A as shown in FIG. 3.

First transistor element 42 further includes a drain terminal coupled to a positive power supply (VDD) and a source terminal coupled to a first end of resistor element 43. The source terminal of first transistor element 42 is further coupled to an output 18 of buffer 6. A second end of resistor element 43 is coupled to a drain terminal of second transistor 41.

Second transistor element 41 includes a gate terminal coupled to second polarity input 16B. In one example, second polarity input 16B is coupled to second polarity output 14B of gain stage 4A as shown in FIG. 3. A source terminal of transistor element 41 is coupled to a negative power supply terminal (VSS).

According to the circuit arrangement of FIG. 4, first and second transistor elements 42 and 41 are configured to receive a first polarity signal at first polarity input 16A and a second polarity signal at second polarity input 16B and substantially simultaneously drive a non-differential signal at buffer output 18. First and second transistor element 42 and 41 may receive DC-biased differential signals at inputs 16A and 16B, respectively. The DC-biased signals may include a bias selected such that a DC voltage level of signals at inputs 16A and 16B stays above a threshold voltage of transistor elements 42 and 41, thus maintaining transistor elements 42 and 41 in an active state.

Because transistors 42 and 41 are always in an active state, transistor elements 42 and 41 are operative to substantially simultaneously drive both the first and second polarity signals as a non-differential signal at buffer output 18. Also, because transistor elements 42 and 41 are always in an active state, each transistor element contributes to an overall gain of an output signal at buffer output 18. As such, a gain of buffer 6 may be selectable based on characteristics of either or both transistor elements 42 and 41, e.g., by selection of transistor processing parameters (for example, width and length of transistor elements 42 and 41).

First transistor element 42 and second transistor element 41 may operate to compensate or bias one another during operation. For example, second transistor element 41 may operate as a signal driven current source driven by a signal at second polarity input 16B. Second transistor element 41 may operate somewhat like a load, or a series resistance, with respect to first transistor element 42. First transistor element 42 may operate as an active load with respect to second transistor element 41. In one example, a source terminal of first transistor element 42 may behave as an inductor and amplify an output signal 18 at a desired frequency. In one example, characteristics of first transistor element 42, e.g., processing characteristics of first transistor element 42 such as transistor width and length, may be selected such that an output of the circuit is amplified at a desired frequency.

Also, due to AC voltage drop at second transistor element 41 may reduce or cancel parasitic elements. In some examples, parasitic elements that may be reduced or canceled include a capacitance between the gate and drain terminals of second transistor element 41, a capacitance between the gate and source terminals of second transistor 41, or an inductance between second transistor 41 and ground.

The buffer 6 of FIG. 4 may be advantageous, because unlike push-pull buffer arrangements, both of transistor elements 41 and 42 are constantly or substantially constantly in an active state during operation, and thus do not switch on and off. For high-speed and/or high frequency data signals, transistor switching may cause undesirable effects, such as, for example, cross talk, crossover distortion, and/or parasitic effects that may degrade buffer performance. By operating transistor elements 42 and 41 to substantially simultaneously drive both polarity signals of a differential signal as a non-differential output signal as described herein, buffer performance may be improved, and a need for additional circuitry to compensate for cross talk and/or parasitic effects may be reduced or eliminated.

Figure 5:
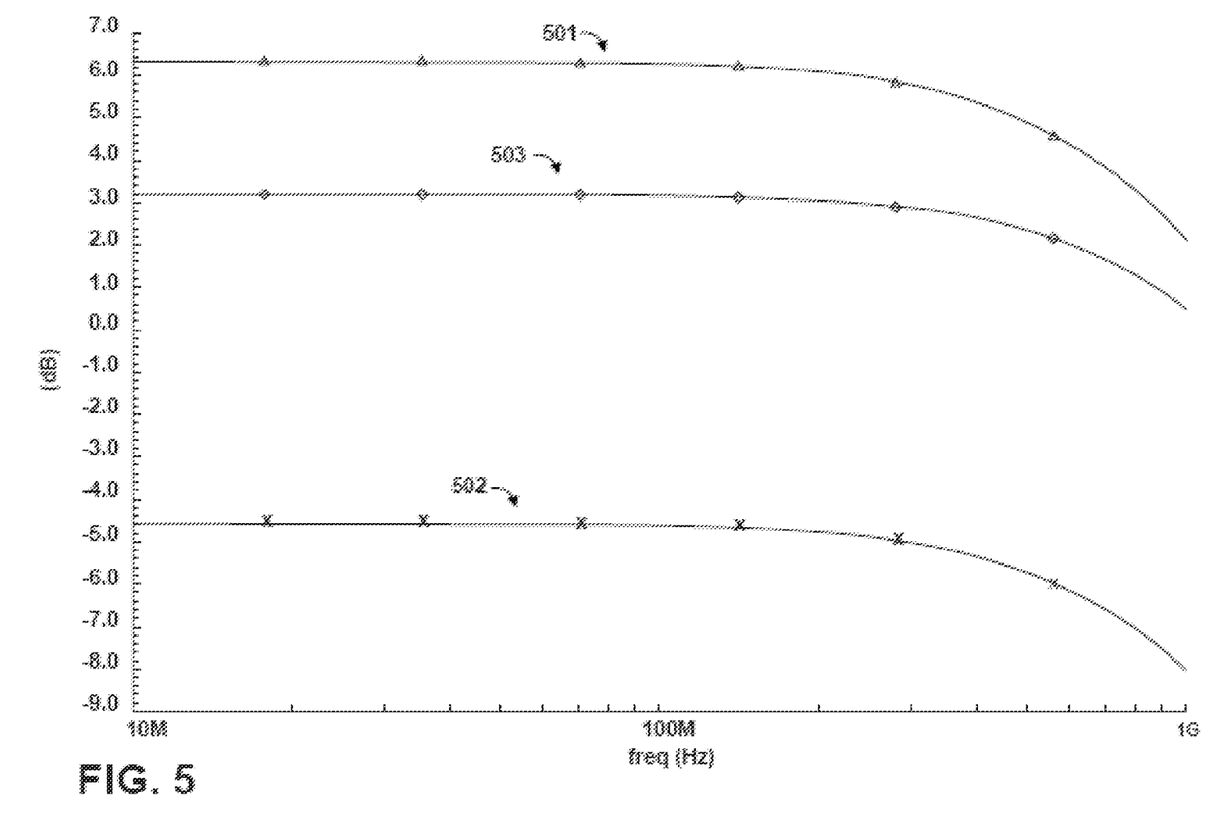
FIG. 5 is a waveform diagram depicting relative contributions of first and second transistors of an RF buffer consistent with this disclosure.

FIG. 5 is a waveform diagram depicting relative contributions of first and second transistor elements 42 and 41 of a buffer, e.g. buffer 6 depicted in FIG. 4, consistent with this disclosure. According to the FIG. 5 example, first transistor element 42 contributes a first gain to a signal at buffer output 18, represented by plot 503. Second transistor element 41 contributes a second gain to the signal at buffer output 18, represented by plot 502. A total gain of a signal at buffer output 18 is shown by plot 501. As depicted in FIG. 5, each of transistor elements 41 and 42 contribute to respective portions of a total gain of the buffer. As such, a total gain 501 of the buffer may be adjusted by selecting characteristics of transistor elements 42 and 41, for example processing parameters of transistor elements 42 and 41.

Figure 6:
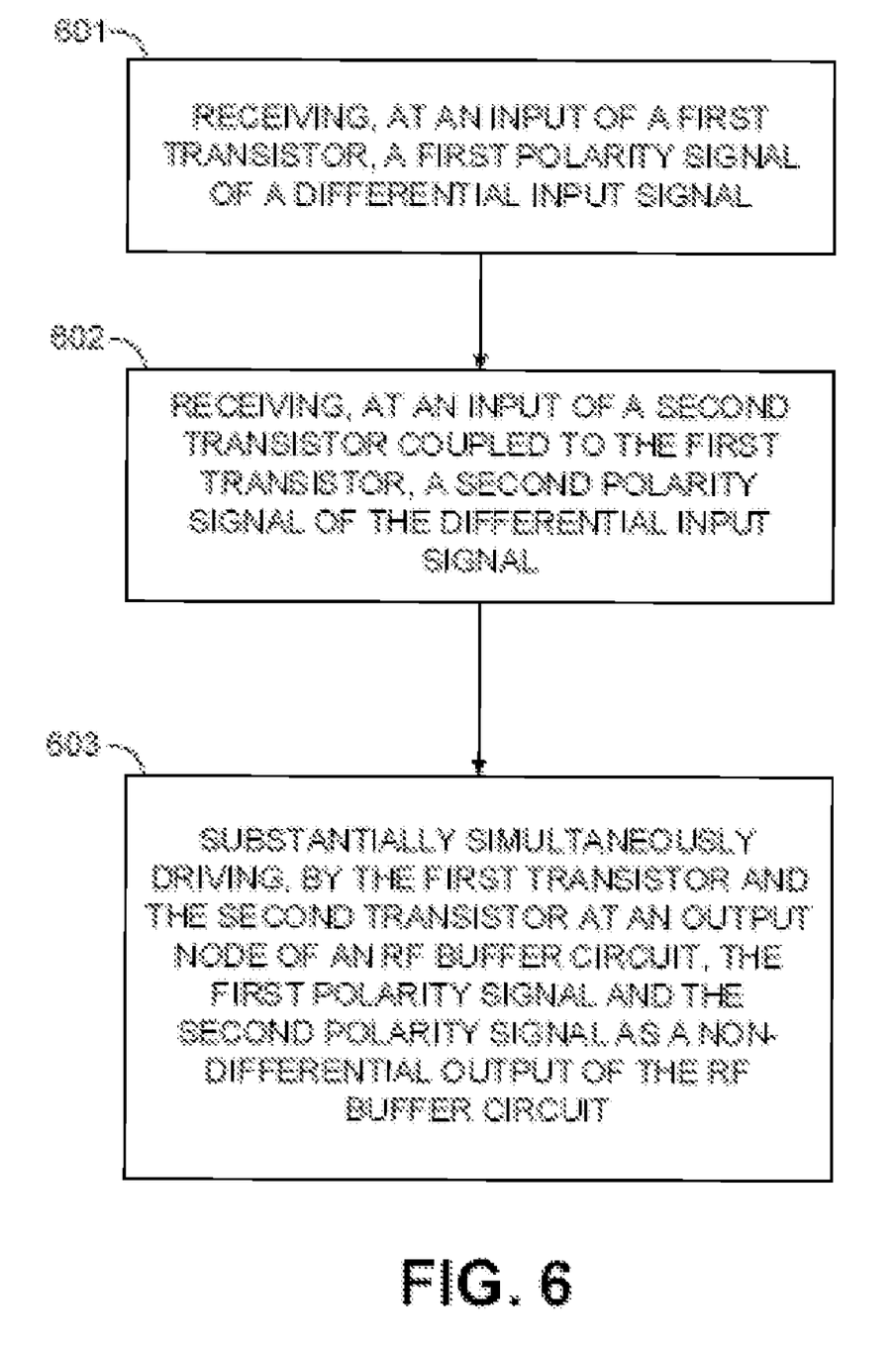
FIG. 6 is a flow chart diagram depicting one example of a method consistent with this disclosure.

FIG. 6 is a flow chart diagram depicting one example of a method of providing a non-differential output signal consistent with the disclosure provided herein. The method includes receiving, at an input of a first transistor element 42, a first polarity signal of a differential input signal (601). The method further includes receiving, at an input of a second transistor element 41, a second polarity signal of the differential input signal (602). The method further include substantially simultaneously driving, by the first transistor element 42 and the second transistor element 41 at an output 18 of an RF buffer, the first polarity signal and the second polarity signal as a non-differential output of the RF buffer 6 (603). In one example, substantially simultaneously driving the first polarity signal and the second polarity signal includes maintaining the first transistor element 42 and the second transistor element 41 in active states, regardless of a signal level of the first polarity signal and the second polarity signal. In one example, receiving, at the input of the first transistor element 42, a first polarity signal and receiving, at the input of the second transistor element 41 a second polarity signal includes receiving a DC-biased first polarity signal and second polarity signal, for example an RF signal that carries a DC offset.

Figure 7:
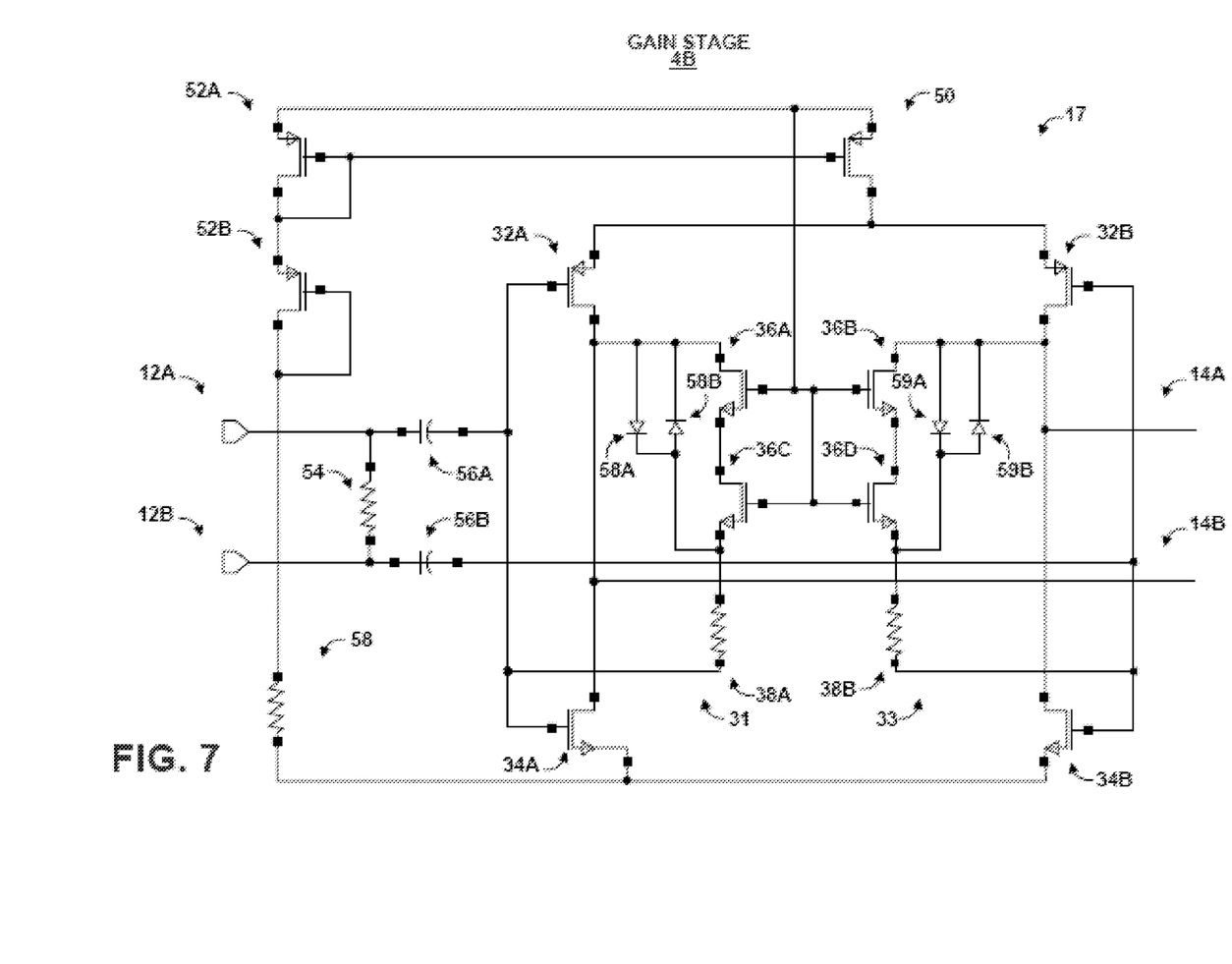
FIG. 7 is a circuit diagram depicting one example of a gain stage that includes power limiting diodes.

FIG. 7 is a circuit diagram showing one example of a gain stage circuit 4B that includes power limiting diodes consistent with this disclosure. The gain stage 4B of FIG. 7 is substantially identical to the gain stage 4A of FIG. 3. However, differential amplifier 17 further includes diodes 58A, 58B, 59A, and 59B. According to the example of FIG. 7, differential amplifier 17 includes diode 58B with a first terminal coupled to a drain terminal of resistor-connected transistor 36A, and a second terminal coupled to a source terminal of resistor-connected transistor 36C. Differential amplifier 17 further includes diode 58A with a first terminal coupled to the drain terminal of resistor-connected transistor 36A and a second terminal coupled to the source terminal of resistor-connected transistor 36C and the second terminal of diode 58B.

Differential amplifier 17 further includes diode 59A with a first terminal coupled to a drain terminal of resistor-connected transistor 36B, and a second terminal coupled to a source terminal of resistor-connected transistor 36D. Differential amplifier 17 further includes diode 59B with a first terminal coupled to the drain terminal of resistor-connected transistor 36B and a second terminal coupled to the source terminal of resistor-connected transistor 36D and the second terminal of diode 59A.

The arrangement of differential amplifier 17 of FIG. 7 may be advantageous, because diodes 58A, 58B, 59A, and 59B may be operative to limit output power of first and second polarity signals at outputs 14A and 14B.

Various circuits have been depicted and described herein. These circuits are provided for exemplary purposes only, and one of skill in the art will recognize that many variations of the circuits described are contemplated. For example, one of skill in the art would recognize that circuits implementing NMOS transistors may in some cases be implemented using PMOS transistors instead. In another example, one of skill in the art will recognize that various circuit elements may be substituted for one another, e.g., a resistor coupled transistor may be substituted for a resistor, or a transistor substituted for a capacitor.

Various embodiments of the invention have been described. These and other embodiments are within the scope of the following claims.

The invention claimed is:

1. A method, comprising:
   receiving, at an input of a first transistor element, a first polarity signal of a differential input signal;
   receiving, at an input of a second transistor element arranged in series with the first transistor element, a second polarity signal of the differential input signal, wherein the second transistor element is coupled to the first transistor element via at least one resistor; and
   substantially simultaneously driving, by the first transistor element and the second transistor element at an output of an RF buffer circuit, the first polarity signal and the second polarity signal as a non-differential output signal of the RF buffer circuit.

2. The method of claim 1, wherein receiving the first polarity signal and the second polarity signal includes receiving the first polarity signal and the second polarity signal from a gain stage.

3. The method of claim 1, wherein substantially simultaneously driving includes driving at a gain substantially equal to a summation of a gain of the first transistor element and a gain of the second transistor element.

4. The method of claim 1, wherein receiving, at the input of the first transistor element includes receiving at an input of an NMOS transistor, and wherein receiving at the input of the second transistor element includes receiving at an input of an NMOS transistor.

5. The method of claim 1, wherein receiving, at the input of the first transistor element includes receiving at an input of a PMOS transistor, and wherein receiving at the input of the second transistor element includes receiving at an input of a PMOS transistor.

6. The method of claim 1, wherein receiving the first and second polarity signals of the differential signal includes receiving DC-biased first and second polarity signals of the differential signal.

7. The method of claim 6, wherein receiving the DC-biased first and second polarity signals includes receiving the first and second polarity signals with a DC bias selected such that the first transistor element and the second transistor element are maintained in an active state.

8. The method of claim 1, wherein substantially simultaneously driving includes driving with both the first transistor element and the second transistor element in active states.

9. A device comprising:
   a differential gain stage that receives a differential input signal and generates a scaled differential signal; and
   an output buffer coupled to the differential gain stage, the output buffer comprising:
      a first transistor element with an input that receives a first polarity of the scaled differential signal, and
      a second transistor element arranged in series with the first transistor element and coupled to the first transistor element via at least one resistor, wherein the second transistor element includes an input that receives a second polarity of the scaled differential signal,
      wherein the first transistor element and the second transistor element substantially simultaneously drive a non-differential output signal of the output buffer.

10. The device of claim 9, wherein the first transistor element is an NMOS transistor, and wherein the second transistor element is an NMOS transistor.

11. The device of claim 9, wherein the first transistor element is a PMOS transistor, and wherein the second transistor element is a PMOS transistor.

12. The device of claim 9, wherein the differential gain stage is configured to generate a DC-biased differential signal.

13. The device of claim 12, wherein a DC-bias of the DC-biased differential signal is selected such that the first transistor element and the second transistor element are maintained in an active state.

14. The device of claim 9, wherein the first transistor element and the second transistor element are configured to operate in an active state regardless of an AC signal level of the first and second polarity of the scaled differential signal.

15. A device comprising:
   means for receiving a differential input signal and generating a scaled differential signal;
   first transistor element means for receiving a first polarity signal of the scaled differential signal; and
   second transistor element means arranged in series with the first transistor element means for receiving a second polarity signal of the scaled differential signal, wherein the second transistor element means is coupled to the first transistor element means via at least one resistor,
   wherein the first transistor element means and the second transistor element means substantially simultaneously drive a non-differential output signal.

16. The device of claim 15, wherein the means for generating the scaled differential signal generate a DC-biased amplified differential signal.

17. The device of claim 16, wherein the first transistor element means and the second transistor element means operate in an active state regardless of an AC signal level of the scaled differential signal.

18. The device of claim 15, wherein the first transistor element means and the second transistor element means are NMOS transistors.

* * * * *